US009577688B2

(12) United States Patent
Danilenko et al.

(10) Patent No.: US 9,577,688 B2
(45) Date of Patent: Feb. 21, 2017

(54) FREQUENCY TUNING OF NARROWBAND LOW NOISE AMPLIFIERS

(71) Applicant: QUALCOMM Technologies International, Ltd., Cambridge (GB)

(72) Inventors: Fedor Danilenko, Montreal (CA); Noshir Dubash, Phoenix, AZ (US); Jeffrey Koeller, Mesa, AZ (US)

(73) Assignee: QUALCOMM TECHNOLOGIES INTERNATIONAL, LTD., Cambridge (GB)

( * ) Notice: Subject to any disclaimer, the term of this patent is extended or adjusted under 35 U.S.C. 154(b) by 0 days.

(21) Appl. No.: 14/629,827

(22) Filed: Feb. 24, 2015

(65) Prior Publication Data

US 2016/0248462 A1 Aug. 25, 2016

(51) Int. Cl.
*H04B 1/12* (2006.01)
*H04B 17/21* (2015.01)
*H03F 1/56* (2006.01)
*H03F 3/191* (2006.01)
*H04B 1/18* (2006.01)

(52) U.S. Cl.
CPC ......... *H04B 1/12* (2013.01); *H03F 1/56* (2013.01); *H03F 1/565* (2013.01); *H03F 3/191* (2013.01); *H04B 1/18* (2013.01); *H04B 17/21* (2015.01); *H03F 2200/222* (2013.01); *H03F 2200/294* (2013.01); *H03F 2200/336* (2013.01); *H03F 2200/378* (2013.01); *H03F 2200/387* (2013.01); *H03F 2200/391* (2013.01); *H03F 2200/399* (2013.01); *H03F 2203/45631* (2013.01); *H03F 2203/45634* (2013.01)

(58) Field of Classification Search
CPC .................. H03F 2200/387; H03F 2200/391; H03F 2200/312; H03F 2203/45631; H03F 2203/45634; H03F 2203/45704; H03F 1/56; H03F 1/565; H03F 2200/222; H03F 2200/294; H03F 2200/336; H03F 2200/399; H04B 17/21; H04B 1/12; H04B 1/123; H04B 1/21
See application file for complete search history.

(56) References Cited

U.S. PATENT DOCUMENTS 4,785,463 A * 11/1988 Janc .................. G01S 19/29
342/386
5,420,904 A * 5/1995 Gulick .................. H04L 1/205
327/31

(Continued)

OTHER PUBLICATIONS

Iulian Rosu, "Understanding Noise Figure", May 30, 2014, pp. 1-13.*

(Continued)

*Primary Examiner* — Sophia Vlahos
(74) *Attorney, Agent, or Firm* — Procopio, Cory, Hargreaves & Savitch LLP

(57) ABSTRACT

A radio frequency (RF) receiver that includes a low noise amplifier (LNA), a tunable resonant circuit, and a processor for performing calibration of the RF receiver. The processor is configured to sweep the tunable resonant circuit through a dynamic range of resonant frequency settings while estimating noise signal output power at the LNA at each setting. The processor is also configured to set the tunable resonant circuit to the setting that produces the greatest noise signal power output at the LNA.

15 Claims, 8 Drawing Sheets

(56) References Cited

U.S. PATENT DOCUMENTS

| | | | | |
|---|---|---|---|---|
| 6,424,824 B1 * | 7/2002 | Stepp | H03J 1/0033 | 348/733 |
| 6,509,799 B1 * | 1/2003 | Franca-Neto | H03F 1/223 | 330/305 |
| 6,978,125 B2 * | 12/2005 | Lindell | H03J 3/08 | 455/183.1 |
| 7,203,472 B2 * | 4/2007 | Seppinen | H04B 17/21 | 375/224 |
| 7,668,521 B2 * | 2/2010 | Vavelidis | H04B 17/21 | 455/193.1 |
| 7,911,277 B2 * | 3/2011 | Paul | H03F 1/56 | 330/284 |
| 8,417,202 B1 * | 4/2013 | Fong | H04B 17/407 | 375/316 |
| 2001/0012770 A1 * | 8/2001 | Pol | H04B 17/20 | 455/232.1 |
| 2005/0085205 A1 | 4/2005 | Behzad et al. | | |
| 2005/0136856 A1 * | 6/2005 | Goldberg | H04B 7/0842 | 455/101 |
| 2007/0202826 A1 * | 8/2007 | Dean | H04B 7/15535 | 455/230 |
| 2008/0318537 A1 * | 12/2008 | Dhamankar | H04B 17/21 | 455/193.1 |
| 2009/0010452 A1 * | 1/2009 | Unno | H03G 3/32 | 381/94.1 |
| 2010/0164648 A1 * | 7/2010 | Kravitz | H03H 7/12 | 333/165 |
| 2013/0281042 A1 * | 10/2013 | Wang | H04B 1/3805 | 455/311 |
| 2014/0035691 A1 * | 2/2014 | Lamanna | H03L 7/099 | 331/36 C |
| 2014/0152394 A1 * | 6/2014 | Chen | G01R 35/00 | 331/36 C |
| 2014/0355655 A1 * | 12/2014 | Chakraborty | H04B 1/40 | 375/219 |
| 2015/0002236 A1 | 1/2015 | Wang et al. | | |

OTHER PUBLICATIONS

International Search Report and Written Opinion—PCT/EP2016/052023—ISA/EPO—Apr. 6, 2016.

\* cited by examiner

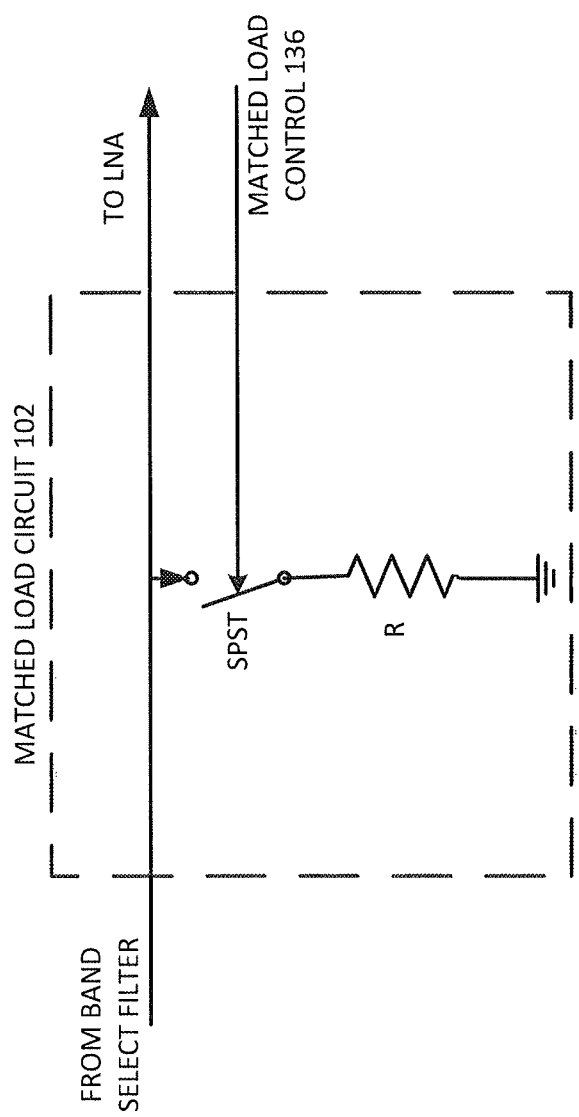

FREQUENCY TUNING OF NARROWBAND LOW NOISE AMPLIFIERS

The application relates, in general, to a system for frequency tuning a low noise amplifier (LNA). More specifically, the application relates to sweeping the LNA through a tuning range in order to maximize power output from the LNA.

BACKGROUND

In conventional radio frequency (RF) receivers, low noise amplifiers (LNAs) are calibrated so that their output power is maximized at a desired frequency of operation. LNAs are typically calibrated because silicon process variations during the manufacturing of the LNAs, affect the resultant LNA operation which may lead to degradation in signal to noise ratio (SNR) and/or sensitivity. These conventional RF receivers typically use additional circuitry (e.g. that turns the LNA into an oscillator) to perform calibration of the LNA. This additional circuitry increases the complexity and the cost of the conventional RF receiver.

SUMMARY

To meet this and other needs, and in view of its purposes, the described system is configured to calibrate a radio frequency (RF) receiver. The RF receiver includes a low noise amplifier (LNA), a tunable resonant circuit, and a processor for performing calibration of the RF receiver. The processor is configured to sweep the tunable resonant circuit through a dynamic range of settings while measuring noise signal output power of the LNA at each setting. The processor is configured to then set the tunable resonant circuit to the setting that produces the maximum noise signal power output at the LNA. It is understood that the foregoing general description and the following detailed description is exemplary, but not restrictive.

BRIEF DESCRIPTION OF THE DRAWINGS

FIG. 2A is a block diagram showing an example of the optional matched load circuit in FIG. 1, suitable for use with the embodiment shown in FIG. 1.

DETAILED DESCRIPTION

As will be described, the example embodiments provide a system and a method for tuning narrowband low-noise amplifiers (LNAs). LNAs are commonly used to amplify signals with low power such as global positioning system (GPS) signals. Thus, LNAs are commonly used in GPS receivers.

In general, the LNA has a selectable gain for amplifying received radio frequency (RF) signals. The LNA may also include a tunable load (i.e. tunable resonant circuit) for tuning (i.e., calibrating) the LNA to operate at a frequency that maximizes its output power.

Figure 1:
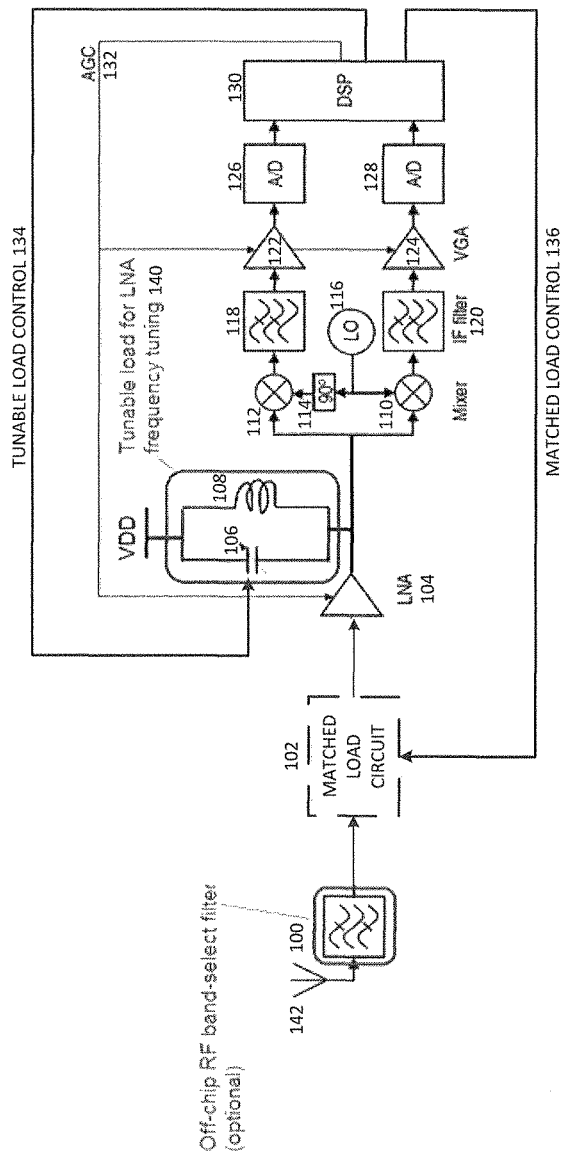
FIG. 1 is a block diagram showing a receiver with a tunable LNA and an optional matched load circuit controlled by a digital signal processor (DSP), according to an example embodiment.

An example of an LNA implemented in an RF receiver is shown in FIG. 1. Specifically, FIG. 1 shows a portion of a super-heterodyne receiver that may be used for GPS applications (i.e., receiving GPS signals). The receiver shown in FIG. 1 includes an antenna 140 for receiving the RF signal (e.g., GPS signals), an optional band select filter 100 for isolating the received RF signal, and a low-noise amplifier 104 for amplifying the received RF signal. The receiver also includes in-phase and quadrature (I/Q) mixer for separating the received RF signal into the I and Q components (e.g. I/Q low intermediate-frequency (IF) signals) and for down-converting the received RF signal to a lower frequency band for processing by DSP controller 130. More, specifically, the I/Q mixer includes mixers 110 and 112, 90° phase shifter 114, and local oscillator 116. The receiver also includes IF filters 118 and 120, variable gain amplifiers (VGA) 122 and 124, and analog-to-digital converters (A/D) 126 and 128.

In addition to these components, the receiver in FIG. 1 includes an optional matched load circuit 102 (described below) and a tunable load (i.e. tunable resonant circuit described below) connected to the output of LNA 104. The example tunable resonant circuit includes a variable capacitor 106 and a fixed inductor 108 configured as an LC circuit, which is connected to an operating voltage VDD. It should be noted that in other examples, the tunable resonant circuit could be implemented in other configurations. In one example, the tunable resonant circuit could include a variable inductor (e.g. an inductor with binary weighted taps and switched conductors between the taps) and a fixed capacitor (not shown). In general, the tunable resonant circuit may be implemented using tunable capacitors and/or tunable inductors in various configurations. The tunable capacitor and/or the tunable inductor may have their respective variable capacitance/inductance controlled by DSP 130.

It should also be noted that DSP 130 also includes automatic gain control (AGC) line 132 for automatically adjusting the gain of amplifiers 104, 122 and 124, tunable load control line 134 for adjusting the capacitance of variable capacitor 106, and matched load control line 136 for controlling the internal components (see FIG. 2) of optional matched load circuit 102.

An example operation for tuning the LNA in the receiver of FIG. 1 is described below. The receiver is described with respect to two operating modes (receiving mode and calibration mode). It should be noted, that although the circuit in FIG. 1 is shown as single ended, it could also be differential (not shown). More specifically, differential configurations (e.g. where LNA 104 and other components in the RF receiver have differential input/output terminals) of the circuit in FIG. 1 could be implemented for low noise operation.

During the receiving mode, RF signals (e.g., GPS signals) are received by RF antenna 142. These RF signals are filtered by an optional band select filter 100. The band select filter 100 may be centered at a frequency of the desired received RF signal (e.g., at the frequencies of the L1 and L2 carrier for the GPS system). During this receiving mode, the RF signal is transferred through optional matched load circuit 102.

Figure 2B:
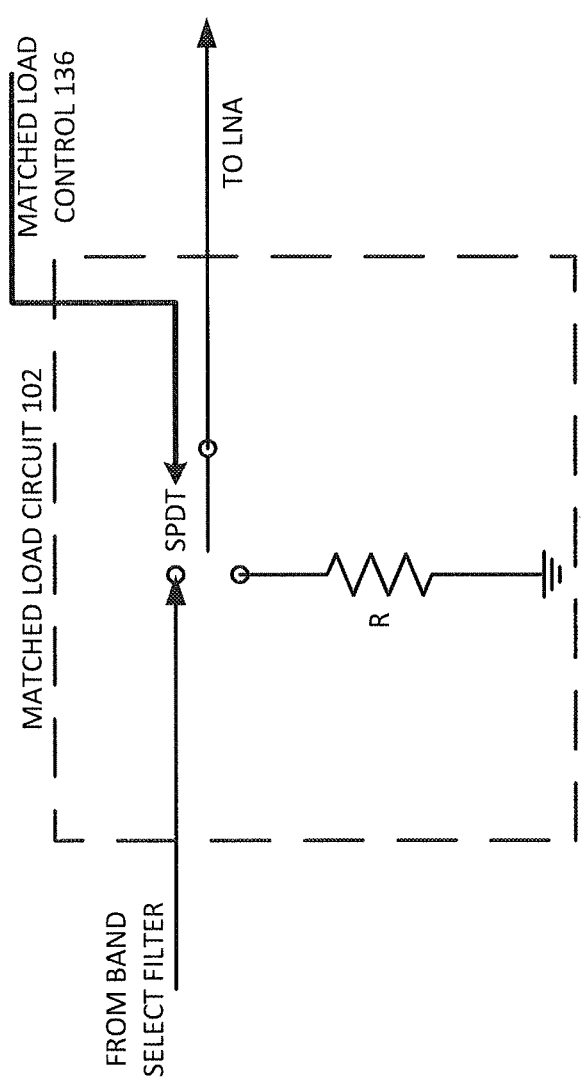
FIG. 2B is a block diagram showing another example of the optional matched load circuit in FIG. 1, suitable for use with the embodiment shown in FIG. 1.

Optional matched load circuit 102 may be implemented in one of two different configurations that are shown in FIGS. 2A and 2B (although other configurations are possible). In FIG. 2A, for example, during the receive mode, the single pole single throw (SPST) switch is opened, thereby allowing the RF signal to pass directly from the band select filter to the LNA 104. Similarly, in the example shown in FIG. 2B, a single pole double throw (SPDT) switch directly connects the band select filter with LNA 104, thereby bypassing resistor R.

In either configuration as shown in FIGS. 2A and 2B, during the receive mode of operation, the RF signal passes directly from the band select filter 100 to LNA 104. LNA 104 then amplifies the RF signal, and passes the amplified RF signal to the I/Q mixer. Specifically, the amplified RF signal is input to mixers 110 and 112. Local oscillator (LO) 116 mixes directly with the RF signal through mixer 110 to produce the I component of the low IF signal. In contrast, LO 116 is shifted by 90°, by phase shifter 114, and then mixed with the RF signal via mixer 112 to produce the Q component of the low IF signal. The I and Q components of the low IF signal are then filtered by IF filters 120 and 118, respectfully, to amplify the I and Q components in the down-converted frequency band (e.g. 2 MHz), which are then amplified by variable gain amplifiers (VGAs) 124 and 122, respectively. These two analog signals are then converted to digital format via analog-to-digital (A/D) converters 128 and 126, respectively. The digitized I/Q low IF components are then input to digital signal processor (DSP) 130 where they are processed for example, by a GPS location algorithm.

DSP 130 processes the digital signal to determine information in the received RF signal. For example, DSP 130 may process the I and Q signals to determine the raw GPS data transmitted from the satellite. In addition, during this receiving mode, DSP 130 may also perform automatic gain control (AGC) via control line 132. The AGC controls the respective gains of LNA 104 and amplifiers 122 and 124 which are all implemented as variable gain amplifiers (VGAs). Essentially, DPS 130 attempts to control the gains of these three components in order to improve the reception of the RF signal (i.e. achieve a higher signal to noise ratio (SNR)).

Although the RF receiver shown in FIG. 1 may operate in a receive mode, as described above, the RF receiver may also operate in a calibration mode to tune LNA 104 to operate at an optimum or near-optimum setting. In order to tune the LNA 104, the receiver enters a calibration mode.

In this calibration mode, DSP 130 controls optional matched load circuit 102 via matched load control line 136, and also controls the tunable resonant circuit 140 via tunable load control line 134. In a first optional step, DSP 130 terminates the input terminal of LNA 104. In order to terminate the input terminal of LNA 104, the DSP 130 controls optional matched load circuit 102 (see FIG. 2) via matched load control line 136.

It is noted that termination of the input terminal of the LNA 104 is optional depending on many factors including but not limited to whether an interfering signal (e.g. jammer) is present, whether a legitimate RF signal (e.g. Frequency Modulated (FM) signal) is present that could possibly affect the calibration, and whether the gain capabilities of the RF receiver are sufficient to amplify white noise. In one example, if interfering signals or other RF signals that may affect calibration are present at the antenna and the RF receiver has sufficient gain, then the RF receiver would terminate the input of LNA 104 with the matched load circuit, thereby using the thermal noise produced by the matched load during the calibration. In another example, if no interfering signals or other RF signals that may affect calibration are present at the antenna, then the white noise received by the antenna may be used as an input to the LNA during the calibration (termination is not needed).

For example, if the receiver in FIG. 1 is a GPS receiver designed for receiving GPS signals, and there are no interfering signal sources, matched load circuit 102 does not have to terminate the input of the LNA. Since GPS receivers tend to have high gain due to the GPS signal having power below the noise floor, the white noise received through the antenna may be amplified and used for calibration. In another example, if the receiver in FIG. 1 is designed for receiving other RF signals (e.g. FM signals), matched load circuit 102 the input of the LNA still may not need to be terminated, assuming the RF receiver has enough gain to properly amplify the white noise received through the antenna, and the other RF signals (e.g. FM signals) received at the antenna will not substantially affect the calibration process. If other RF signals are present and the input to the LNA needs to be terminated, the receiver may switch additional amplification into the signal path during the calibration to ensure that the amplified thermal noise signal from the matched load has sufficient amplitude to be digitized by the ADC.

In general, when the matched load circuit is included in the receiver, the input terminal of LNA 104 does not need to be terminated with matched load resistor R when there are no significant interfering signals or other RF signals present that may affect calibration, and when the RF receiver has enough gain to properly amplify the white noise received through the antenna. Thus, the matched load circuit does not have to be included in the receiver (i.e. the matched load circuit is optional).

For example, as shown, DSP 130 may control the SPST switch in FIG. 2A or the SPDT switch in FIG. 2B (depending on which configuration is used), to connect (i.e., electrically couple) the input terminal of the LNA to a matched load resistor R (e.g. 50 ohms), thereby terminating the input terminal of the LNA. For example, in FIG. 2B, SPDT switch is controlled to connect R directly to the input of the LNA. In this configuration, the LNA is no longer connected to the band select filter, and therefore does not receive the RF signal at its input. In the configuration in FIG. 2A, the SPST switch is controlled to connect resistor R to the input terminal of LNA. Assuming resistor R has a low enough impedance, the input RF signal from band select filter (even though still connected to the LNA) does not substantially affect the input of the LNA. In either example, the input terminal of LNA is connected to the matched load resistor R that is used for calibration.

The reason for connecting the input terminal of LNA 104 to matched load resistor R is to perform calibration based on random thermal noise of the matched load (i.e., thermal noise produced by resistor R). Thus, after matched load circuit 102 is switched by DSP 130, the input signal to LNA 104 is the random thermal noise produced by load resistor R, which is then amplified by LNA 104 and processed by the remaining components of the receiver.

After the matched load circuit 102 has been controlled by DSP 130 to connect load R to the input terminal of the LNA, calibration commences by tuning variable capacitor 106 in tunable load circuit 140. As shown in FIG. 1, the tunable load circuit 140 (i.e. tunable resonant circuit) may include a variable capacitor 106 which is controlled by DSP 130 along with a fixed inductor 108.

Figure 3:
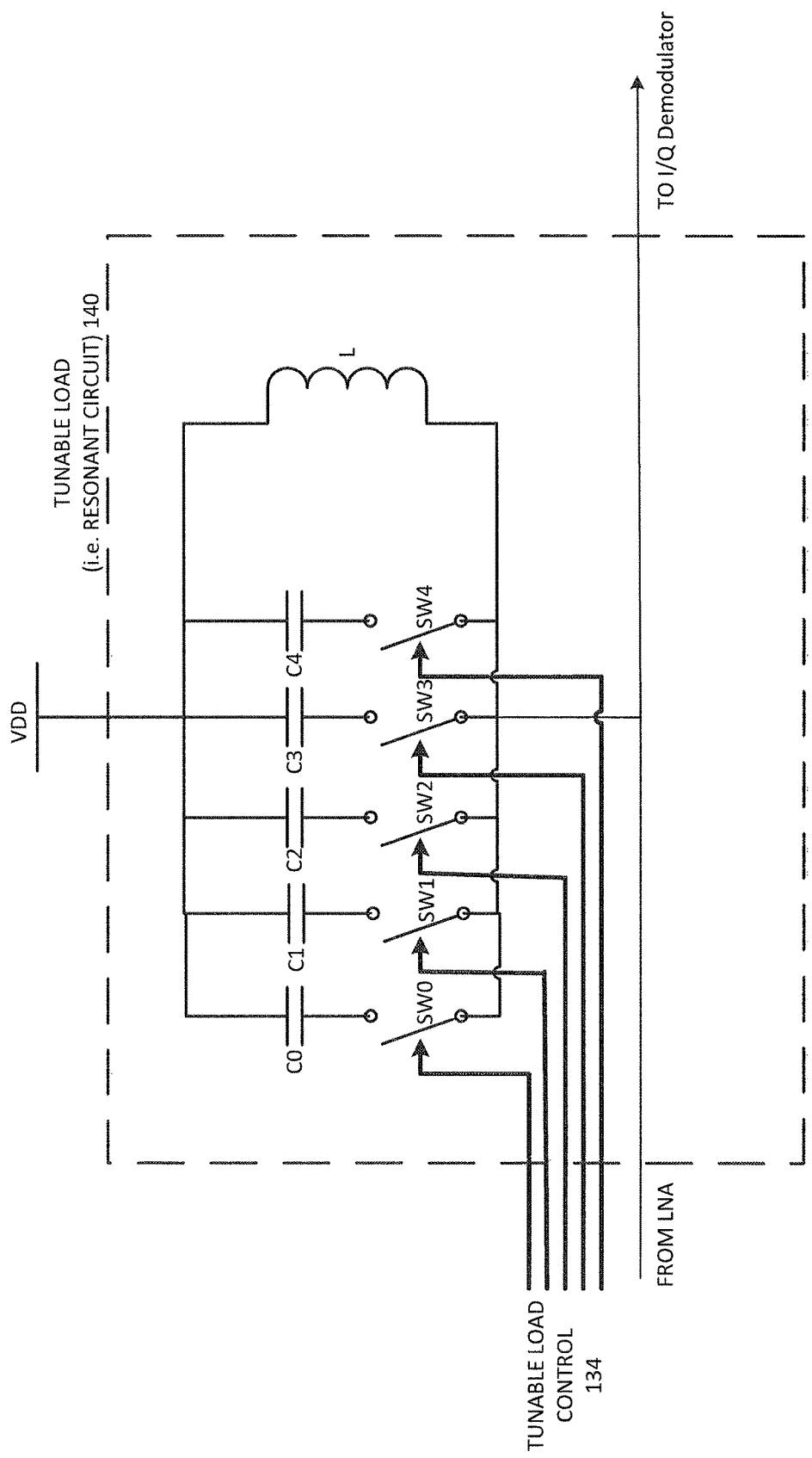
FIG. 3 is a block diagram showing an example of the tunable load circuit in FIG. 1.

Further details of the tunable load circuit 140 are shown in FIG. 3 where the inductor L is connected in parallel to a bank of capacitors to form a variable tank circuit. In this example, the variable tank circuit includes a bank of switched capacitors C0, C1, C2, C3 and C4 which are switched in and out of the resonant circuit by switches SW0, SW1, SW2, SW3 and SW4, respectively. All three of these switches are controlled by tunable load control line 134 of DSP 130.

In one example, the capacitors may have fixed capacitances that are weighted in a binary manner (e.g. $C*2^N$, where N is the bit index of the capacitor with respect to the 5 bit binary control word). For example, capacitor C0 may have a capacitance C, capacitor C1 may have a capacitance value of 2C, capacitor C2 may have a capacitance value of 4C, capacitor C3 may have a capacitance value of 8C, and capacitor C4 may have a capacitance value of 16C, etc. This configuration allows DSP 130 to sweep the variable tank circuit through thirty-two different capacitance settings of a dynamic range of the variable tank circuit (e.g. 5 bits of dynamic range). Although five capacitors are shown in FIG. 3, it is noted that different applications may use more capacitors or fewer capacitors.

In the calibration mode, DSP 130 controls switches SW0 to SW4 in order to sweep the variable tank circuit through all thirty-two possible frequencies at which the variable tank circuit resonates. At each of these settings, the variable tank circuit affects (i.e. increases/decreases in amplitude) the amplified thermal noise signal output from LNA 104. The output signal of LNA 104 is sent through the I/Q mixer, and then into DSP 130 where it is processed. Because the input signal to the LNA is the random thermal noise (e.g. white noise) of the resistor R.

Although FIG. 3 shows a configuration with a bank of capacitors, it is contemplated that a bank of inductors could be used instead. In an embodiment, not shown, fixed inductor L could be replaced with a fixed capacitor C. In addition, capacitors C0-C4 could be replaced with individual inductors L0-L4 (not shown) or a single inductor (not shown) with 5 binary-weighted taps and switched conductors (jumpers) between the taps and connected to the 5 switches respectively. The controller would tune the circuit in FIG. 3 similar to the manner described above. Alternatively, the variable capacitor could be a continuously variable varactor diode (not shown) coupled to a digital to analog converter (DAC) (not shown), instead of, or in addition to, the switched capacitor bank shown in FIG. 3. In this configuration, the DAC may be controlled by DSP 130 to generate a voltage across the varactor diode that produces the desired capacitance value.

In one example, the goal of DSP 130 is to maximize the power of the noise signal output by LNA 104. Thus, DSP 130 attempts to determine the variable tank circuit setting (i.e. which capacitors to connect and disconnect from the resonant circuit) that results in the maximum noise signal power output of LNA 104.

Figure 4:
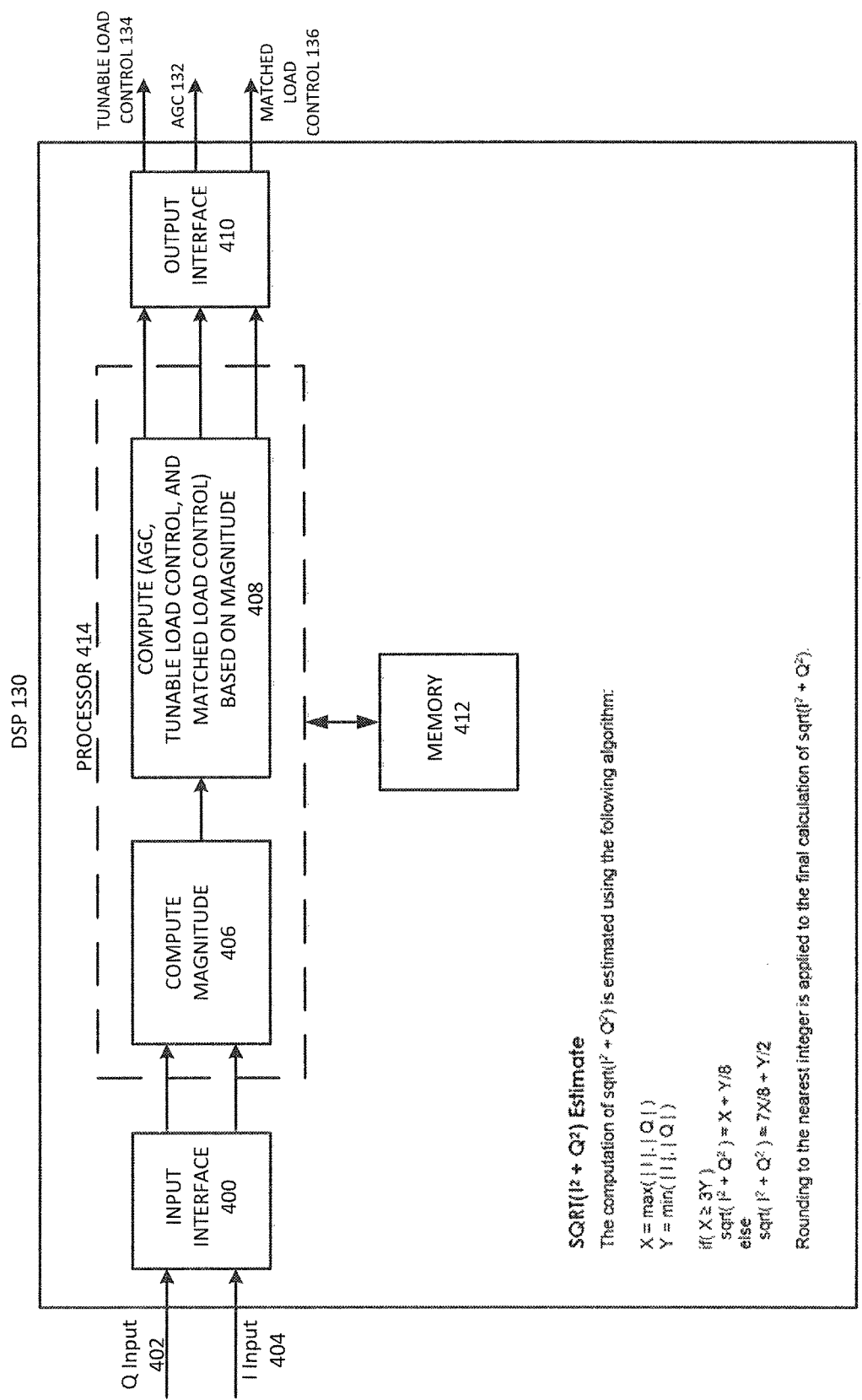
FIG. 4 is a block diagram showing hardware for computing a signal power estimation.

Shown in FIG. 4 is an example of the hardware of DSP 130 shown in FIG. 1. Specifically, DSP 130 may include multiple hardware components such as input interface 400 for receiving the digitized Q input 402 and I input 404, processor 414 for performing the processing of the I and Q components, output interface 410 for outputting the three control signals including tunable load control 134, AGC control 132 and matched load control 136. DSP 130 may also include a memory device 412 for interacting (e.g. storing software, storing data, etc.) with the processor.

In one example shown in FIG. 4, processor 414 receives the I and Q components and attempts to determine the setting of tunable load control circuit 134 that results in the greatest power output of LNA 104. As DSP 130 controls the tunable load control circuit 134 to step through each possible capacitor setting, processor 414 computes the magnitude of the I and Q signals in block 406. This magnitude may be computed in hardware, software or a combination of the two. In one example, the magnitude is computed by the processor 414 by calculating an estimate of the square root of the sum of the squares of the digitized I and Q components. An example of this estimation is shown as pseudo-code at the bottom of FIG. 4.

It is noted that although I and Q signals are utilized in the example of the receiver shown in FIG. 1, I and Q signals are not necessary in this receiver. Specifically, the RF signal may simply be down converted and processed to determine magnitude without separating the RF signal into its I and Q components.

Once processor 414 computes a magnitude of the I and Q components, the processor 414 then generates the tunable load control signal 134 for tuning load 140. This control signal is output through interface 410. It should be noted that the processes performed by processor 414 may be stored in memory 412 which may include software that the processor executes to compute the magnitude of the I/Q signals and to generate the three control signals. It is noted, that processor 414 also computes the automatic gain control signal 132 for performing automatic gain control, and the control signal 136 for the optional matched load control of the matched load circuit 102. These signals are also output through interface 410.

Thus, processor 414 controls the tunable load circuit via tunable load control 134 to sweep through all 32 possible capacitor settings. At each of the 32 capacitor settings, processor 414 computes the magnitude of the amplified thermal noise signal using the I and Q components and stores this magnitude in memory 412. Once all possible settings are swept through (e.g., all thirty-two possibilities), a setting that produces the greatest magnitude (i.e., the maximum noise signal power of LNA 104), is selected by processor 414 via tunable load control 134 as the setting to utilize during a subsequent receiving mode of the receiver. In another example, the processor 414 can sweep through the settings until a peak is encountered. Once a peak is encountered, the processor 414 stops sweeping through the settings (e.g. if when processing the 13$^{th}$ setting, the system determines that a peak occurred at setting 12, then the processor does not have to sweep through all 32 settings).

Figure 5:
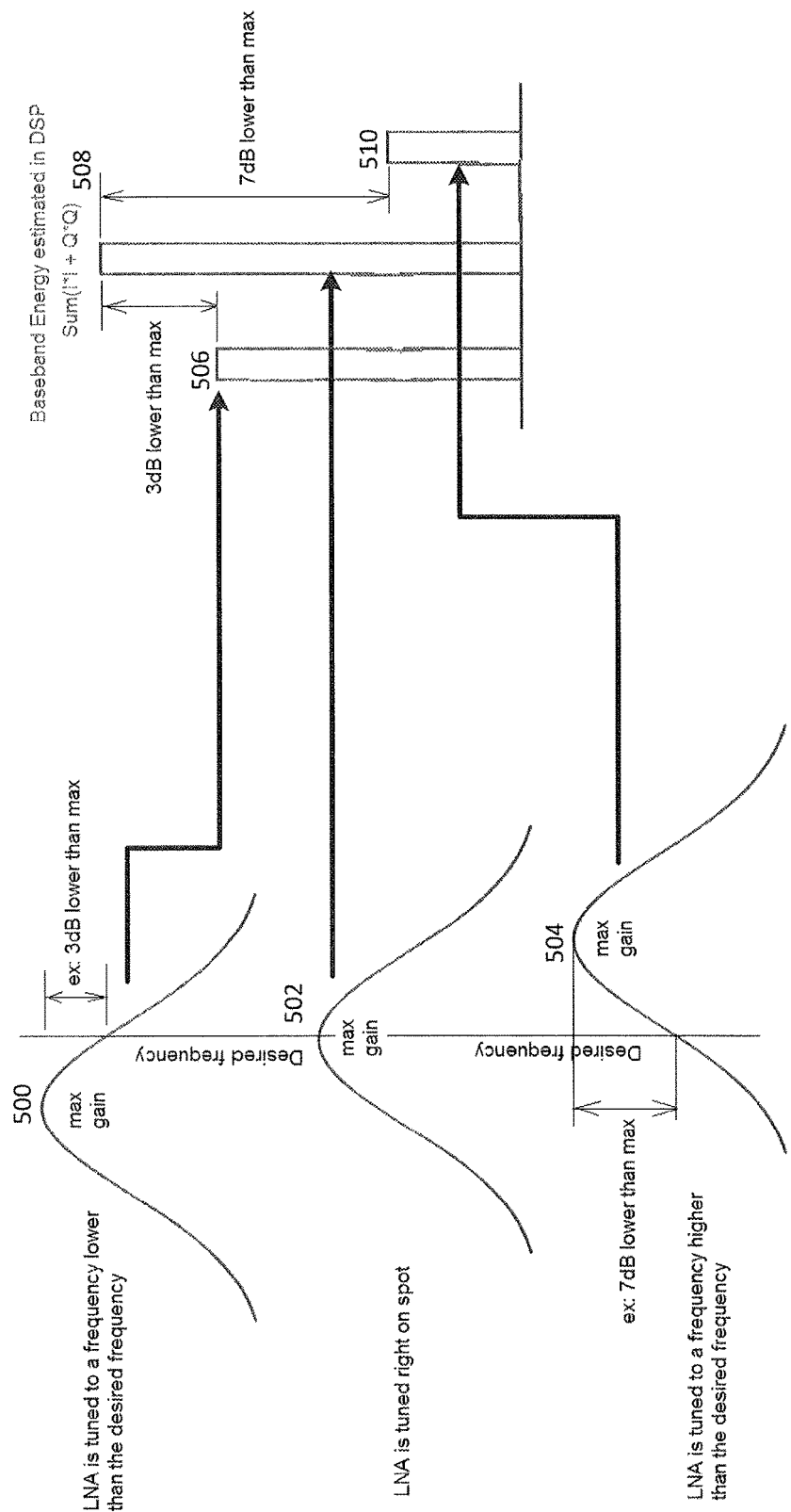
FIG. 5 shows three data plots of receiver output power as the LNA in FIG. 1 is tuned.

An example of the maximum power of the LNA is shown in FIG. 5, where three different data curves 500, 502 and 504 of the LNA output power computed by DSP 130 are shown for three different settings of the tunable load circuit 140. In the first setting, the LNA output power 500 is 3 decibels (dB) lower than the maximum as shown by power plot 506. In the third setting, the LNA output power 504 is 7dB lower than its possible maximum as shown by power plot 510. However, at the second setting, the output power of the LNA 502 is at a maximum as shown by power plot 508.

Although only three settings of the tunable load circuit 140 are shown in FIG. 5, it is noted that the receiver in FIG. 1 may sweep through all settings of the bank of capacitors shown in FIG. 3. An example of DSP 130 sweeping through all 32 settings of the bank of capacitors in FIG. 3 is shown by the data table and plot in FIG. 6.

Figure 6:
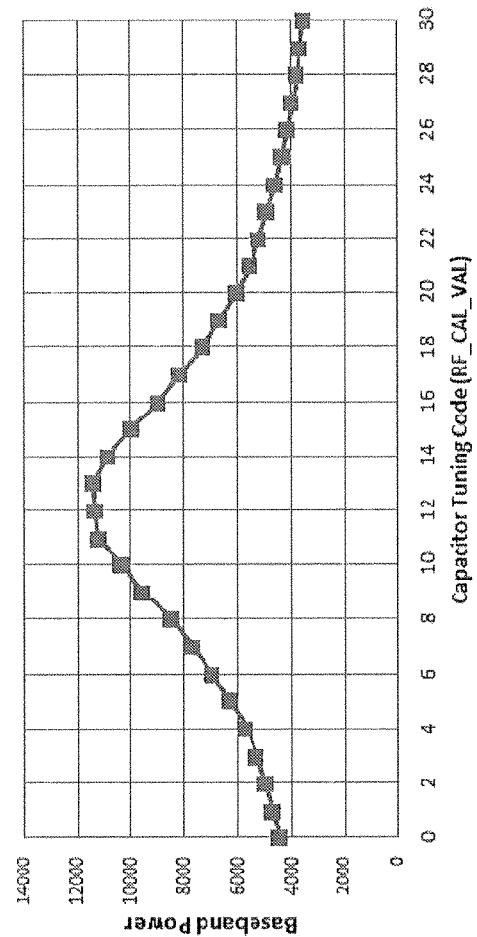
FIG. 6, shows another data plot and corresponding data for an example of receiver output power as the LNA in FIG. 1 is tuned.

Specifically, FIG. 6 shows the magnitude computed by the processor in DSP 130 for each of the possible 32 settings (32 permutations) of the capacitors in the capacitor bank of FIG. 3. It is noted from the data table, and from the data plot, that the 13$^{th}$ setting produces the maximum LNA output power (i.e. magnitude of 11,400). Thus, the calibration mode in this example has determined that the maximum power of the LNA occurs at the 13$^{th}$ setting of resonator circuit 140.

The values on the Y-axis of the data plot in FIG. 6 indicate the baseband power, which are calculated in by DSP 130 based on the magnitude of the I and Q samples. In one example, these values are calculated according to the formula: sum(I*I+Q*Q) divided by a number N of the I/Q samples (e.g. N=1024) produced by A/D 126 and A/D 128. In general, the I and Q samples are processed digitally in DSP 130 (e.g. filtered and decimated), and input to block 406 in FIG. 4 which may implement the formula shown above.

It should be noted that the units of the baseband power indicated on the Y-axis of the data plot in FIG. 6 are dimensionless, and can vary from one implementation to another, depending on how many I and Q samples are summed, depending on a reference voltage used by the A/D 126 and A/D 128, and depending on a resolution (bit-width) of the I and Q samples that are input to block 406. The units of baseband power are not of importance, because the system is trying to determine the maximum baseband power which is performed by a relative comparison among these values.

Once the maximum setting is determined, the calibration mode may be ended and a subsequent receive mode may begin. Specifically, to switch from the calibration mode, to the receive mode, DSP 130 performs two basic operations. First, it selects the 13$^{th}$ setting (i.e., the optimum setting) of the bank of capacitors in the tunable load circuit 140. This allows the LNA 104 to operate at an optimum tuning code (output the greatest power) for the received signal. Second, matched load circuit 102 is controlled to disconnect matched load resistor R from the input terminal of the LNA as shown in FIG. 2. This allows the LNA 104 to once again receive the RF signals from RF antenna 142. Third, the AGC loops are unfrozen so that the gains of LNA 140 and VGAs 126 and 128 may be controlled by DSP 130 to tend to maximize (e.g. optimize) the power at the output of the A/Ds 126 and 128.

Figure 7:
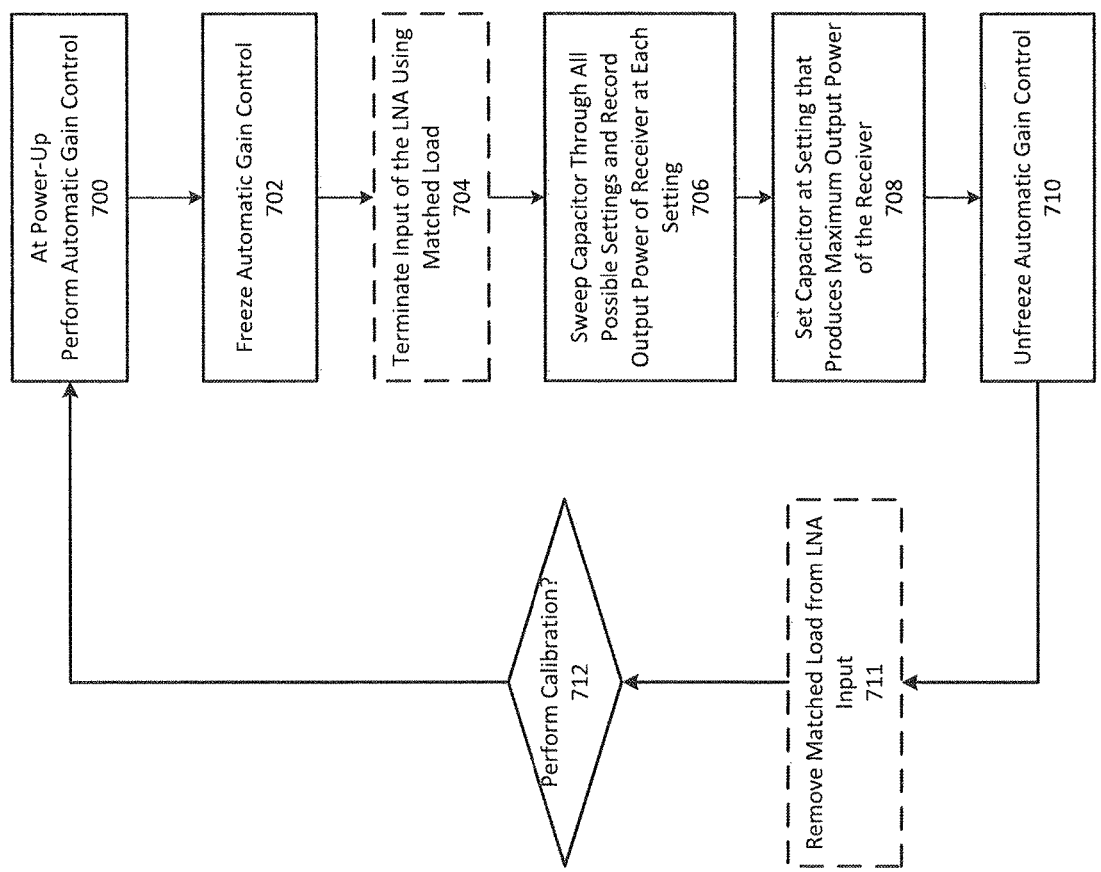
FIG. 7 is a flowchart describing the operation of calibrating the receiver in FIG. 1.

The overall operation of the receiver in FIG. 4 is now described with respect to the flowchart in FIG. 7. It is already noted that there are two modes to the operation of the RF receiver shown in FIG. 1. The first mode is a calibration mode where the input terminal of the LNA is connected to a matched load while the tunable load circuit 140 is swept through all possible settings to determine the maximum output power of the LNA. In the receive mode, the LNA 104 is connected to the RF antenna 142 and band select filter 100, and disconnected from the matched load R. In this receive setting, the tunable load circuit 140 is set at the setting that produce the maximum power output of the LNA during the calibration mode.

As shown in FIG. 7, the calibration mode of the receiver in FIG. 1 may be performed at power-up of the receiver (i.e., when the receiver is turned ON). Specifically, in step 700, DSP 130 performs AGC of LNA 104 and VGAs 122 and 124 via AGC control line 132. Essentially, the DSP 130 determines the optimum gain settings for LNA 104 and VGAs 122 and 124 that result in the greatest power at the output of the A/Ds 126 and 128 (i.e. the AGC operates on noise rather than a signal received through the antenna). Once the AGC is performed in step 700 based on the received RF signal, the AGC is frozen in step 702 (i.e., the DSP 130 holds the AGC of LNA 104 and VGAs 122 and 124 at the desired settings). It should be noted, that when AGC is being performed, the capacitors in the tunable load circuit 140 may be set to a default value. This default value may be set by the designer of the system, which may be optimized for a nominal silicon process. Alternatively, this default value may be set to the middle value of the tank circuit range (e.g. assuming a 5 bit control word, the tank circuit can be set to the 16$^{th}$ setting). In either example, the default value may be set when the receiver powers up.

Once the AGC is frozen in step 702, DSP 130 may control the optional matched load circuit 104 to connect matched load R (see FIG. 2) to the input terminal of LNA 104 in step 704 (i.e. terminate the input terminal of the LNA). Then, in step 706, DSP 130 sweeps the capacitors shown in FIG. 3 through a dynamic range which may include all 32 possible settings. This control is performed by opening and closing switches SW0, SW1, SW2, SW3 and SW4 in a binary sequence. At each of these settings, DSP 130 computes the magnitude of I and Q signals, and stores these magnitudes in memory 412. In step 708, DSP 130 retrieves the computed magnitudes from memory 412 (after the tunable load circuit 140 has been swept through its dynamic range), to determine the maximum magnitude of the combined I and Q signal components. In step 708, the setting of the resonant circuit 140 that produce the maximum output power of the LNA is set as the setting to be used during the receive mode.

After the maximum setting of the tunable load circuit is set by DSP 130, DSP 130 then unfreezes the AGC loops via AGC line 132, in step 710, and removes the optional matched load from the LNA input in step 711 (i.e., the matched load resistor R shown in FIGS. 2A and 2B is disconnected from the input to the LNA using the SPST or SPDT). After step 710, the receiver can operate in the receive mode to receive the RF signals (i.e., the GPS signals). Since LNA 104 has been properly calibrated during the calibration mode, LNA 104 produces a high quality amplified signal. This can be particularly important in GPS applications where the GPS signal is a weak signal that is buried below the noise floor.

It should be noted, that when receiving GPS signals, terminating and un-terminating the matched load circuit to/from the LNA input terminal is not needed (unless a jammer signal or other interfering signal is present). In this example, assuming that the receiver has a matched load circuit, the matched load will not be connected to the input terminal of the LNA in step 704. The white noise received from the antenna is input to the LNA (bypassing the matched load), and used for calibration. The receiver still performs steps 706, 708 and unfreezes the AGC loop in step 710. Alternatively, if the receiver in FIG. 1 is designed to be a GPS receiver, then matched load circuit 102 may not be included (i.e. terminating and un-terminating the matched load circuit in steps 704 and 710 are not performed, because there is no matched load circuit in the receiver).

Although the calibration may be performed at power-up, as described in step 700, calibration may also be performed in different situations as shown in step 712. Specifically, the calibration may be performed based on periodic scheduling (e.g., once an hour, once a day, etc.) or may be performed when the DSP 130 determines that the RF signal quality has fallen below a threshold (e.g., the error rate of the received data is unacceptable). In yet another example, calibration may be performed based on the thermal condition of the RF receiver (i.e. calibration is performed if the temperature exceeds a temperature threshold as determined by a temperature sensor located in the RF receiver).

The above described system and method essentially allow the receiver to measure the amplified noise power level in the matched load R in order to maximize the LNA output. This allows the receiver to compute the largest output noise power which corresponds to the largest LNA gain at the desired RF frequency such as the RF frequency for receiving GPS signals. Terminating the input of the LNA with a matched load (e.g., 50 ohm resistor), during the calibration mode, ensures that there are no external signals or jammers present at the LNA input and that a constant noise power level can be determined. Also, by freezing the AGC during the calibration process, it is ensured that the measured baseband power variation is caused solely by the LNA gain variation due to tunable load circuit 140.

This system and method is simpler than conventional systems which turn the LNA into an oscillator, because Applicants' system does not require additional circuitry to generate positive feedback to perform oscillation, or a frequency counting circuit used by the oscillator based method, and does not allow large signal oscillations to potentially leak out of the RF input violating the Federal Communications Commission (FCC) radio frequency interference (RFI) requirements and potentially jamming other radios as in the oscillator based method. This saves silicon area which results in lower production costs. Also, the addition of the matched load circuit at the LNA input is a simple and low cost solution to implement.

Although the system is illustrated and described herein with reference to specific embodiments, it is not intended to be limited to the details shown. Rather, various modifications may be made in the details within the scope and range of equivalents of the claims.

What is claimed:

1. A radio frequency (RF) receiver, comprising:
a low noise amplifier (LNA) having an input terminal for receiving a noise signal and an output terminal for outputting an amplified noise signal;
a tunable resonant circuit coupled to the output terminal of the LNA;
a mixer coupled to the LNA and configured to mix the amplified noise signal with a signal from a local oscillator to produce a down-converted noise signal; and
a processor coupled to the mixer and to a control terminal of the tunable resonant circuit, the processor configured to
set the tunable resonant circuit to a plurality of settings,
measure a power of the down-converted noise signal at each setting,
determine a setting corresponding to a greatest power of the down-converted noise signal, and
set the tunable resonant circuit to the setting corresponding to the greatest power of the down-converted noise signal, wherein the processor is further configured to perform automatic gain control of the LNA, then stop the automatic gain control of the LNA prior to setting the tunable resonant circuit to the plurality of settings, measuring the power of the down-converted noise signal at each setting, and then start the automatic gain control of the LNA after setting the tunable resonant circuit to the setting corresponding to the greatest power of the down-converted noise signal.

2. The RF receiver of claim 1, wherein:
the tunable resonant circuit includes an inductor and a bank of capacitors coupled together as a variable tank circuit, and
the processor is further configured to selectively couple and decouple the capacitors in the variable tank circuit in order to set the tunable resonant circuit to the plurality of settings.

3. The RF receiver of claim 2, wherein the capacitors in the bank have respective capacitances $C*2^N$ where C is a predetermined capacitance and N is an integer index number of the capacitor in the bank.

4. The RF receiver of claim 1, further comprising:
a matched load circuit including an impedance element and a switch that is selectively coupled to an input terminal of the LNA, and
wherein the processor is coupled to a control terminal of the matched load circuit and is further configured to:
couple the impedance element of the matched load circuit to the input terminal of the LNA prior to measuring the power of the down-converted noise signal, and
de-couple the impedance element of the matched load circuit from the input terminal of the LNA to amplify an RF signal received by an antenna of the RF receiver after setting the tunable resonant circuit to the setting corresponding to the greatest power of the down-converted noise signal.

5. The RF receiver of claim 1, wherein the processor is further configured to perform a calibration process based on at least one of a power up of the RF receiver, a periodic scheduling, operating temperature of the RF receiver, a detection of reduced signal quality or a manual request, the calibration process including setting the tunable resonant circuit to the plurality of settings, measuring the power of the down-converted noise signal at each setting, and determining the setting corresponding to the greatest power of the down-converted noise signal.

6. The RF receiver of claim 1, wherein the noise signal is thermal noise of a resistor.

7. The RF receiver of claim 1, further comprising a filter configured to filter the down-converted noise signal before the processor measures the power of the down-converted signal.

8. A method for tuning a radio frequency (RF) receiver, comprising:
amplifying, by a low noise amplifier (LNA), a noise signal received through an input terminal of the LNA to produce an amplified noise signal;
setting a tunable resonant circuit coupled to an output terminal of the LNA to a plurality of settings;
mixing the amplified noise signal with a local oscillator signal to produce a down-converted noise signal;
estimating a power of the down-converted noise signal at each setting;
determining a setting corresponding to a greatest power of the down-converted noise signal;
setting the tunable resonant circuit to the setting that produces the greatest power of the down-converted noise signal;
performing a calibration process based on at least one of: a power up of the RF receiver, a periodic scheduling, an operating temperature of the RF receiver, a detection of reduced signal quality and a manual request, the calibration process including:

setting the tunable resonant circuit coupled to the output terminal of the LNA to the plurality of settings, mixing the amplified noise signal with the local oscillator signal to produce a down-converted signal, estimating a power of the down-converted noise signal at each setting, and determining the setting corresponding to the greatest power of the down-converted noise signal; and performing automatic gain control of the LNA, then stopping the automatic gain control of the LNA prior to the calibration process, and then starting the automatic gain control of the LNA after setting the tunable resonant circuit to the setting that produces the greatest power of the down-converted noise signal.

9. The method of claim 8, wherein mixing the amplified noise signal with the local oscillator signal includes generating in-phase and quadrature (I/Q) components of the down-converted signal, and wherein estimating the power of the down-converted signal include computing a magnitude of the I/Q components of the down-converted signal.

10. The method of claim 8, including selectively coupling and decoupling each of a plurality of capacitors in a bank of capacitors together with an inductor as a variable tank circuit in order to set the tunable resonant circuit to the plurality of settings.

11. The method of claim 10, including controlling the capacitors in the bank using a binary control word that has a number of bits equal to the number of capacitors in the bank.

12. The method of claim 8, wherein the noise signal is thermal noise from a matched load circuit.

13. A radio frequency (RF) receiver, comprising:

a matched load circuit including an impedance element and a switch;

a low noise amplifier (LNA) having an input terminal configured to receive a noise signal and an output terminal for outputting an amplified noise signal;

a variable tank circuit coupled to the output terminal of the LNA;

an in-phase and quadrature (I/Q) mixer having an input terminal coupled to the output terminal of the LNA and having first and second output terminals for outputting down-converted I/Q noise signals; and a processor coupled to the output terminals of the I/Q mixer, coupled to a control terminal of the variable tank circuit, and coupled to the switch of the matched load circuit, the processor configured to selectively couple the impedance element of the matched load circuit to the input terminal of the LNA, set the variable tank circuit to a plurality of resonant frequency settings while measuring a power of the down-converted I/Q noise signals at each setting, determine a setting corresponding to a greatest power of the down-converted I/Q noise signals, set the variable tank circuit to the setting that produces the greatest power at the down-converted I/Q signals terminals;

selectively decouple the impedance element of to the matched load circuit from the input terminal of the LNA; and compute an automatic gain control of the LNA to adjust the gain of the LNA prior to setting the variable tank circuit to the plurality of resonant frequency settings while measuring the power at the down-converted I/Q noise signals at each setting.

14. The RF receiver of claim 13, wherein the processor is further configured to stop the automatic gain control of the LNA prior to setting the variable tank circuit to the plurality of resonant frequency settings while measuring the power at the down-converted I/Q noise signals at each setting, and then start the automatic gain control of the LNA after setting the variable tank circuit to the setting that produces the greatest power at the down-converted I/Q noise signals.

15. The RF receiver of claim 13, wherein the variable tank circuit includes an inductor and a bank of capacitors coupled together as a variable tank circuit, and the processor is further configured to selectively couple and decouple the capacitors in the variable tank circuit in order to set the variable tank circuit to the plurality of resonant frequency settings.

* * * * *